United States Patent [19]

Moore et al.

[11] Patent Number: 5,801,952
[45] Date of Patent: Sep. 1, 1998

[54] APPARATUS AND METHOD FOR POWER DISTURBANCE ANALYSIS AND STORAGE OF UNIQUE IMPULSES

[75] Inventors: Robert E. Moore, San Jose; Frederic W. Nitz, Boulder Creek; Michael A. Gipe, Saratoga, all of Calif.

[73] Assignee: Reliable Power Meters, Inc., Los Gatos, Calif.

[21] Appl. No.: 700,938

[22] Filed: Aug. 21, 1996

Related U.S. Application Data

[62] Division of Ser. No. 245,779, May 19, 1994, abandoned.

[51] Int. Cl.[6] .................................................. G01R 27/28
[52] U.S. Cl. ........................ 364/483; 364/487; 324/102; 324/113; 360/5
[58] Field of Search ........................ 364/480, 481, 364/483, 487, 492; 324/102, 112, 113, 121 R; 361/97, 111; 360/5

[56] References Cited

U.S. PATENT DOCUMENTS

| | | | |
|---|---|---|---|
| 3,059,235 | 10/1962 | Sammis et al. ................ | 346/7 |
| 3,344,406 | 9/1967 | Vinal ............................. | 364/900 |
| 3,633,101 | 1/1972 | Johnson et al. ................ | 324/113 |
| 3,662,380 | 5/1972 | Cargile ........................... | 324/112 |
| 3,836,851 | 9/1974 | Schumann ...................... | 324/112 |
| 4,019,040 | 4/1977 | Thompson ....................... | 364/900 |
| 4,064,488 | 12/1977 | Chapman ........................ | 364/487 |
| 4,110,684 | 8/1978 | Gale ............................... | 324/102 |
| 4,156,280 | 5/1979 | Griess ............................. | 364/481 |
| 4,206,413 | 6/1980 | Cox et al. ........................ | 324/102 |
| 4,484,290 | 11/1984 | Bagnall et al. ................. | 364/483 |
| 4,558,379 | 12/1985 | Hutter et al. ................... | 360/5 |
| 4,559,602 | 12/1985 | Bates, Jr. ........................ | 364/487 |
| 4,585,990 | 4/1986 | Murphy ........................... | 324/102 |
| 4,589,074 | 5/1986 | Thomas et al. ................. | 364/483 |
| 4,642,563 | 2/1987 | McEachern et al. ........... | 324/102 |
| 4,694,402 | 9/1987 | McEachern et al. ........... | 364/487 |
| 4,727,314 | 2/1988 | Lapeyrolerie et al. .......... | 324/102 |
| 4,901,009 | 2/1990 | Schultze et al. ................ | 324/121 R |
| 4,905,285 | 2/1990 | Allen et al. ..................... | 364/487 |
| 4,985,844 | 1/1991 | Foley et al. ..................... | 364/487 |
| 5,081,592 | 1/1992 | Jenq ............................... | 364/487 |
| 5,111,149 | 5/1992 | Lebesch ........................... | 364/487 |
| 5,151,866 | 9/1992 | Glaser et al. ................... | 364/487 |
| 5,170,359 | 12/1992 | Sax et al. ........................ | 364/481 |
| 5,216,621 | 6/1993 | Dickens ........................... | 364/483 |
| 5,229,651 | 7/1993 | Baxter, Jr. et al. .............. | 364/487 |
| 5,257,206 | 10/1993 | Hanson ........................... | 364/502 |
| 5,483,153 | 1/1996 | Leeb et al. ...................... | 364/483 |
| 5,515,288 | 5/1996 | Aberson .......................... | 364/474.15 |

*Primary Examiner*—Eric W. Stamber
*Attorney, Agent, or Firm*—Townsend and Townsend and Crew LLP

[57] ABSTRACT

A power monitoring system with associated signal processing and storage capabilities. Impulses that are superimposed on an alternating-current electrical signal are identified and evaluated based upon amplitude, duration, and phase position. Impulses that are not substantially similar to impulses on immediately preceding cycles of the input signal are recorded. In a further embodiment, if a series of substantially identical impulses occurs, a count of the number of impulses is stored, and detailed data is stored for only the first impulse in the series. In another embodiment, the impulses are ranked according to a quality factor, and data for the impulse with the lowest quality factor is deleted from a storage device when the device becomes full.

5 Claims, 5 Drawing Sheets

APPARATUS AND METHOD FOR POWER DISTURBANCE ANALYSIS AND STORAGE OF UNIQUE IMPULSES

This is a division of application Ser. No. 08/245,779 filed May 19, 1994, now abandoned.

BACKGROUND OF THE INVENTION

This invention relates generally to an apparatus and method for analyzing power quality, particularly for power delivered to a building by a utility.

Typical prior art power monitoring instruments provide inputs for signals corresponding to the voltage and current of a line to be monitored. To accommodate three-phase power systems, individual inputs are provided for each of the three phases.

Within a typical prior art power monitoring instrument, a multiplexer couples the various inputs to a single sampling circuit. Multiple cycles, typically eight, of a power signal present on a given input are sampled before the multiplexer switches to the next input. After all the inputs have been sampled, calculations must be performed on the samples before sampling can be resumed. The necessary calculations require approximately one second of computation time for single phase power and approximately two seconds for three phase power. Thus, for three phase power, over 100 cycles are missed before the instrument can resume processing the next set of sampled data. Only a small fraction of any one input signal is actually sampled. Multiplexing also introduces data skewing; a small error is introduced due to the time it takes for the multiplexer to change channels.

Prior art power monitoring instruments also record impulses. Impulses are captured and recorded by a thermal paper printer and/or disk storage device connected to the power monitoring instrument. However, thresholds must be programmed to determine the minimum magnitude of impulse to be captured and recorded. The need to program thresholds presents problems in that without advance knowledge of the characteristics of the power signal it is difficult to properly select a threshold. If a threshold is set too high, impulses of interest are missed. If a threshold is set too low, excessive recording of impulses causes the exhaustion of available paper and/or disk storage leading to the suspension of monitoring and a resulting loss of events.

Other problems are posed by the limited buffer storage available to store impulses while they are evaluated for permanent storage. Normal, expected impulses in a power signal can block the recording of aberration impulses that are desired to be recorded. For example, full wave rectifiers incorporated in typical power supply transformers introduce two charging impulses per cycle. With three phase power, six impulses are introduced every cycle. However, the available buffer storage in some prior art power monitoring instruments only permits six impulses to be stored before overwriting occurs. Thus, there is no possibility of tracking impulses for longer than a single cycle and if another source of impulses exists, even one cycle cannot be thoroughly analyzed.

It is desirable to derive power quality information from samples taken over the entirety of each relevant power signal. It is also desirable to record all impulses of interest while conserving on available disk storage. What is needed is a power quality measurement apparatus which provides power quality information derived from the entirety of power signals and can store all desired power disturbance information without the need to program thresholds in advance.

SUMMARY OF THE INVENTION

The invention provides a power monitoring system with associated signal processing and storage capabilities. In accordance with the invention, the power monitoring system captures disturbances (impulses or other fluctuations of interest) present on one or more input electrical signals and conserves available storage by dynamically selecting particular disturbances for storage and deletion. The selection strategies employed store only those disturbances which are not repetitive of earlier disturbances and upon exhaustion of available capacity, delete disturbances in order of increasing interest.

Available storage (buffer storage and disk) is further conserved by varying the storage space occupied by a single impulse based on its measured decay time. In the prior art, each stored impulse occupied a fixed amount of storage space regardless of actual length.

Historical data for an electrical signal is retained and displayed by dividing the electrical signal in the time domain into segments. A detected disturbance of the electrical signal forms a boundary between two segments. For each such boundary, the steady-state value of a signal parameter such as root-mean-square (rms) voltage is stored for the two segments delimited by the boundary. Samples of the electrical signal immediately surrounding the boundary are stored so that disturbances of interest can be closely inspected. By only storing transitional data, it is not necessary to continuously store data during a segment, thus conserving storage space and allowing for unattended long-term monitoring without loss of data.

Voltage and current measurements for a given electrical signal are sampled and digitized and then employed to derive a total power signal, a total harmonic distortion signal, and a reactive power signal. The derived signals are then used to construct and display a unique power quality graph wherein the three axes correspond to the three derived signals. An electrical signal with optimal power quality appears on the display as a vector aligned with the axis corresponding to total power, giving a simple, easily understood visual representation of complex power quality elements.

The invention will be better understood upon reference to the following detailed description in connection with the accompanying drawings.

DESCRIPTION OF SPECIFIC EMBODIMENTS

Figure 1:
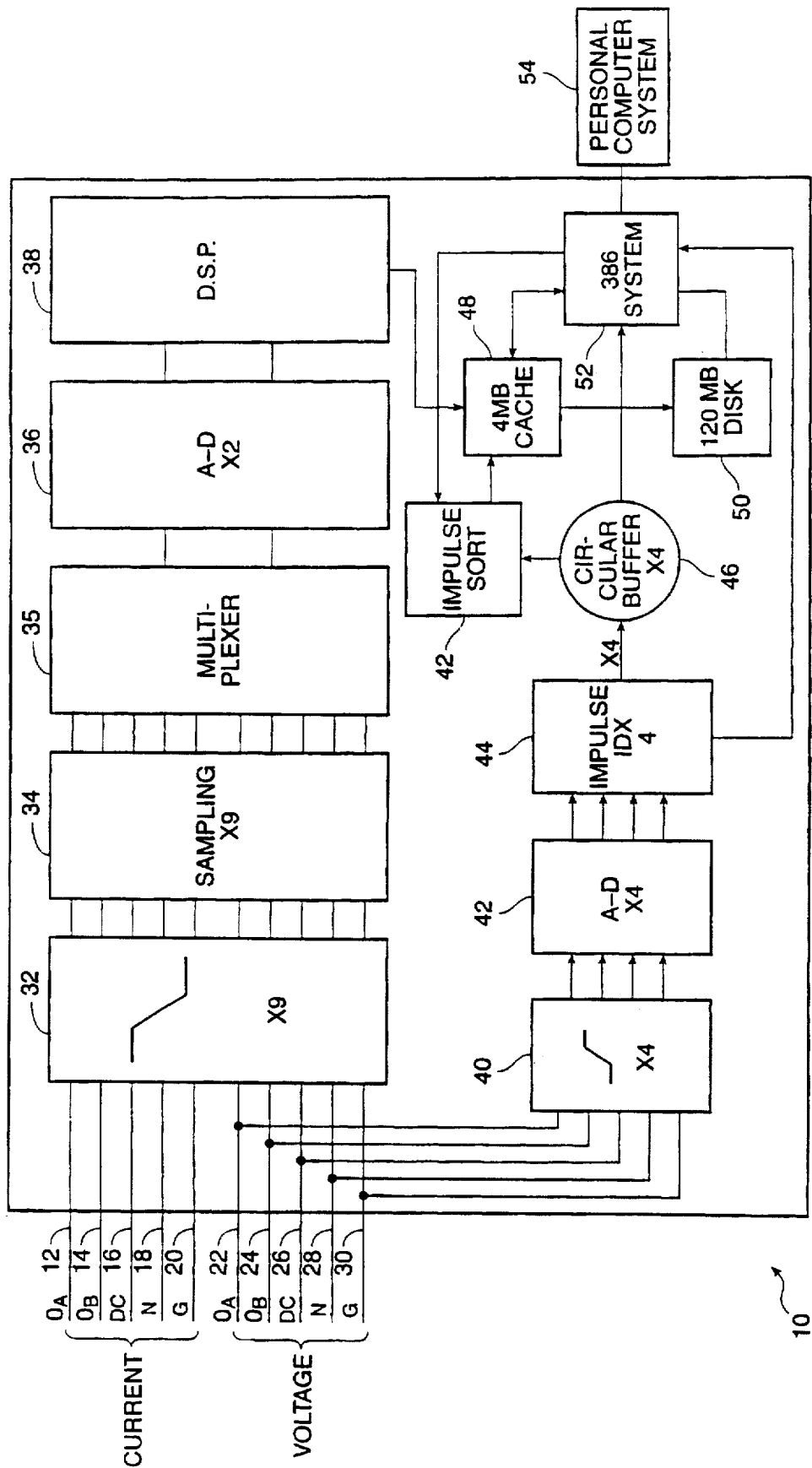
FIG. 1 is a block diagram of a power monitoring system in accordance with the invention.

FIG. 1 is a block diagram of a power monitoring system 10 in accordance with the invention. The power monitoring system 10 has input connections 12, 14, 16, 18, 20 for current measurements of each of three phases of a power signal, a neutral signal, and a ground signal. The power monitoring system 10 has input connections 22, 24, 26, 28, 30 for voltage measurements for the three phases of the power signal, neutral and ground. The power monitoring system includes a low-pass filter 32, a sampler 34, a multiplexer 35 and an analog-to-digital (A-D) converter 36, a digital signal processing circuit 38, a high-pass filter 40, analog-to-digital (A-D) converter 42, an impulse identification circuit 44, a circular buffer storage device 46, an impulse sorter circuit 47, a 4 MB cache memory unit 48, a 120 MB disk storage device 50, and an Intel 80386 microprocessor system 52. Power monitoring system 10 has an interface to a computer 54.

In the preferred embodiment, low-pass filter 32 actually incorporates nine distinct filtering circuits corresponding to the five current inputs and the four non-ground voltage inputs. Sampler 34 similarly incorporates nine distinct sampling circuits. Multiplexer 35 multiplexes nine outputs of sampler 34 onto two inputs of A-D converter 36. A-D converter 36 incorporates conversion circuits for both outputs of multiplexer 35. In an alternative embodiment, multiplexer 35 has a single output and A-D converter 36 incorporates only one conversion circuit. In the preferred embodiment, high-pass filter 40, A-D converter 42, impulse identification circuit 44, and circular buffer storage device 46 similarly incorporate distinct elements for each of the four non-ground voltage inputs.

The power monitoring system of the invention, can be understood as having two sets of channels, a low frequency sampling channel set consisting of low-pass filter 32, sampler 34, A-D converter 36, and digital signal processing circuit 38, and a high frequency sampling channel set consisting of high-pass filter 40, A-D converter 42, impulse identification circuit 44, and circular buffer storage device 46.

Inputs 12-30 are connected to probes which are attached to the appropriate points to be monitored in a power circuit. If single phase power is to be measured, two of the three phase connections may be omitted for both voltage and current.

The high frequency sampling channel set will be discussed first. The available voltage signals are inputs to high-pass filter 42 with ground input 30 used as a reference. The filtered voltage signals are converted to sequences of digital samples by A-D converter 42. Impulses superimposed on the electrical signal are identified by impulse identification circuit 44.

Figure 2:
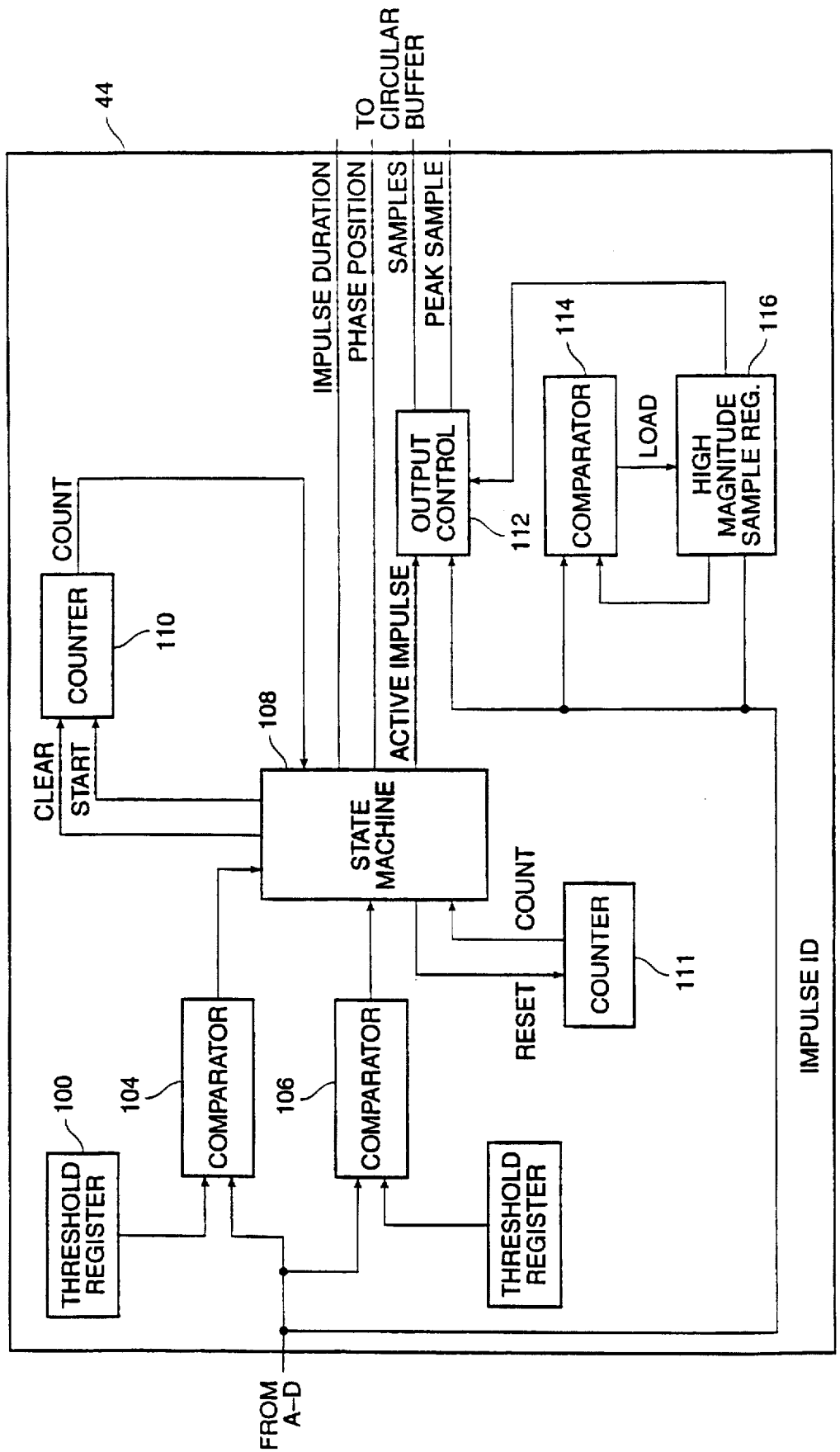
FIG. 2 is a block diagram of an impulse identifier in accordance with the invention.

FIG. 2 is a schematic diagram of impulse identification circuit 44 in accordance with the invention. FIG. 2 depicts the circuitry for identifying impulses on a single voltage signal while in the preferred embodiment, four sets of the depicted circuitry are included for identifying impulses on the four input voltage signal lines with the input ground used as a reference. The impulse identification circuit 44 as shown includes a threshold register 100, a threshold register 102, a comparator 104, a comparator 106, a state machine 108, a counter 110, a counter 111, an output control 112, a comparator 114, and a high magnitude sample register 116.

In the preferred embodiment, impulse identification circuit 44 is implemented as a field programmable logic array (FPLA).

Figure 3:
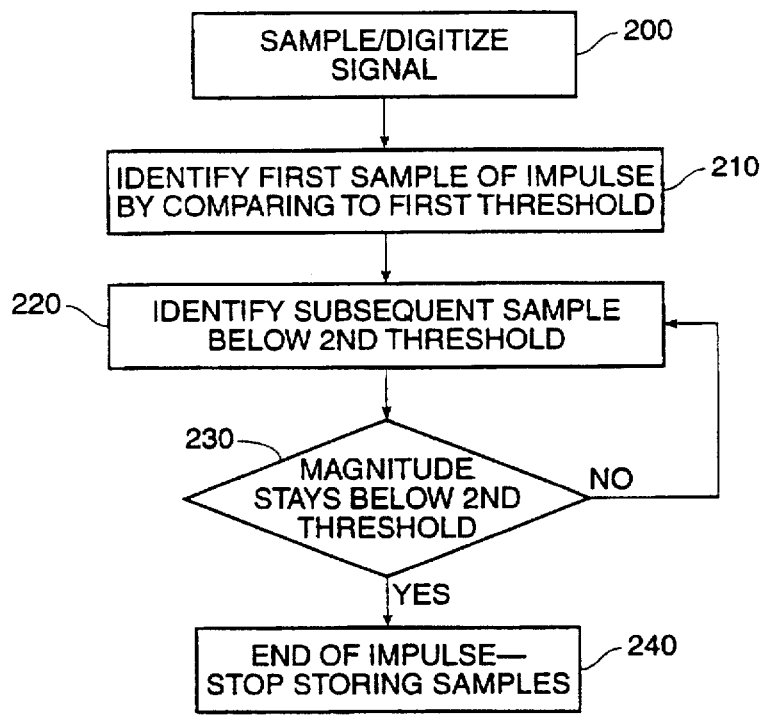
FIG. 3 is a flowchart describing the steps of identifying, in accordance with the invention, an impulse superimposed on an electrical signal.

FIG. 3 is a flowchart describing the steps of identifying, in accordance with the invention, an impulse superimposed on a signal. The signal is sampled at step 200. In the preferred embodiment, the signal is high-pass filtered in high-pass filter 40 prior to sampling. Also, in the preferred embodiment, A-D converter 42 is a 4 MHz, 10 bit converter that performs sampling step 200 and digitizes the resulting samples so that all subsequent processing is accomplished digitally.

The samples are input to impulse identification circuit 44. At step 210, comparator 104 identifies the first sample of an impulse by comparing the magnitude of incoming samples to a first predetermined threshold stored in threshold register 100. The first sample to exceed the threshold triggers comparator 104. Once the threshold is identified, state machine 108 notes the beginning of the impulse and starts counter 110 to measure the duration of the impulse. State machine 108 also activates output control 112 to pass samples of the impulse to circular buffer storage device 46.

Unlike prior art impulse identification techniques, the present invention does not assign a fixed length to all impulses but rather analyzes every impulse to determine its length. Accordingly, at step 220, succeeding samples of the impulse are compared by comparator 106 to a second predetermined threshold stored in threshold register 102. At step 230, state machine 108 monitors counter 110 and comparator 106 to determine when samples of the impulse have remained below the second predetermined threshold for a fixed period of time, preferably six sample intervals, to reliably indicate the end of the impulse. If the impulse has ended, output control 112 halts sending samples to circular buffer storage device 46 at step 240. If the samples return to a magnitude above the second predetermined threshold, impulse identification circuit 44 returns to step 220. In the preferred embodiment, the first and second predetermined thresholds are the same.

By employing the impulse identification method described in FIG. 3, the present invention economizes on the storage available in circular buffer storage device 46. Prior art power monitoring systems store 1 ms of samples for each impulse, regardless of actual decay time and require 32 kilobytes (kB) to store only 6 impulses. By comparison, the impulse identification method of the invention, by dynamically varying the number of samples stored for each impulse, permits as many as 40-50 impulses to be stored in the same storage space. In the preferred embodiment, 256 kB of buffer storage are provided, thus permitting storage of up to 400 impulses.

Figure 4A:
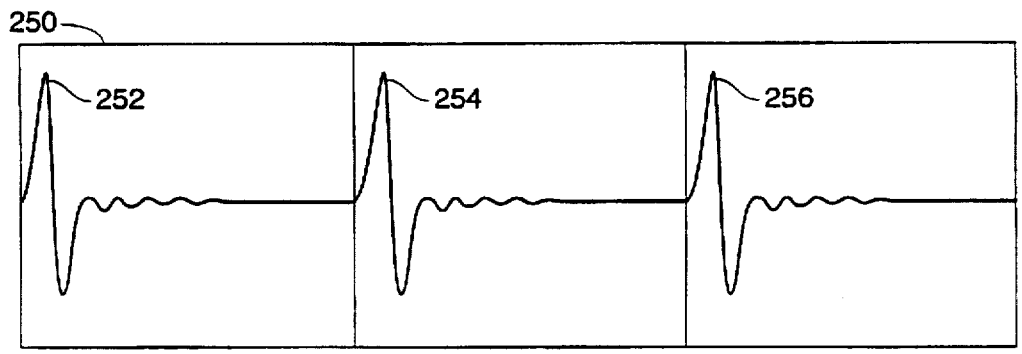
FIG. 4A illustrates the organization of impulse buffer storage in accordance with the prior art.
Figure 4B:
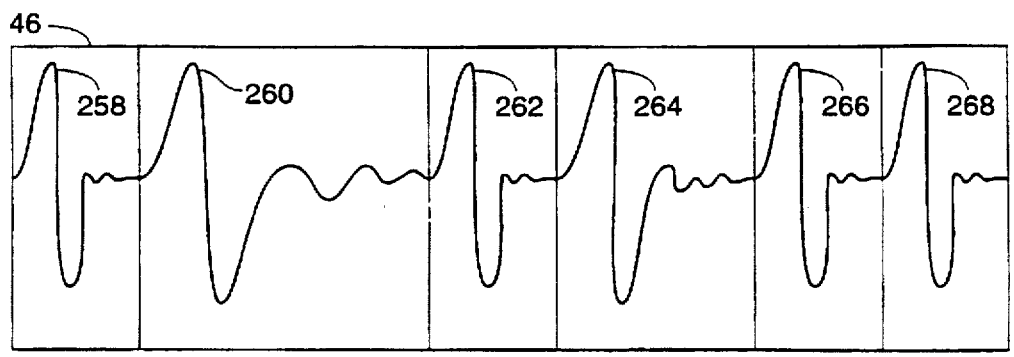
FIG. 4B illustrates the organization of impulse buffer storage in accordance with the invention.

FIGS. 4A and 4B illustrate the storage efficiency advantage provided by the invention. FIG. 4A illustrates the organization of a portion of a buffer storage device 250 of a prior art power monitoring system. Impulses 252, 254, and 256, each occupy an identical amount of storage space regardless of the fact that impulses 252 and 256 do not in fact require their entire allotment. FIG. 4B illustrates the organization of a similarly sized portion of buffer storage device 46. In accordance with the invention, impulses 258, 260, 262, 264, 266, and 268 each occupy the minimum amount of needed storage space, thereby increasing the number of impulses that may be stored.

Figure 5:
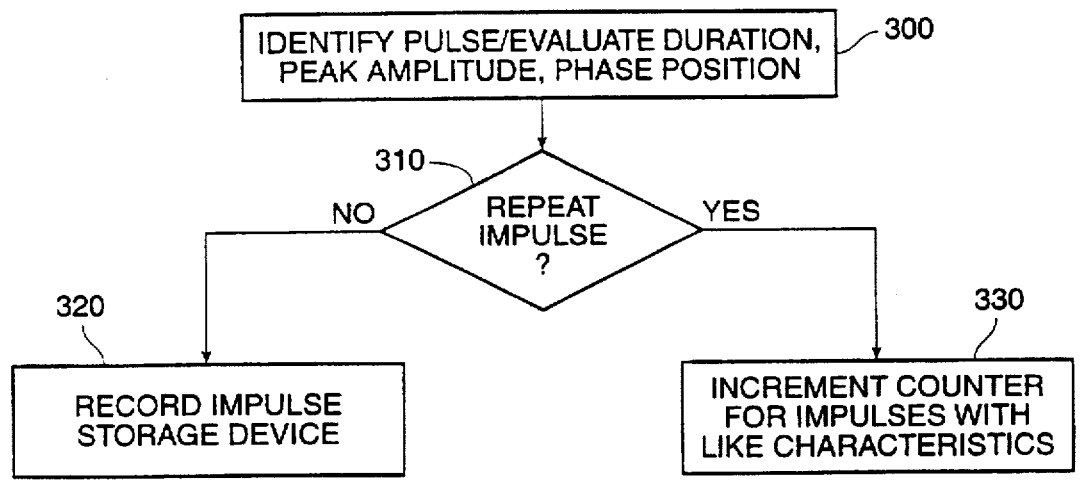
FIG. 5 is a flowchart describing the steps of selecting, in accordance with the invention, an impulse for long-term storage.

FIG. 5 is a flowchart describing the steps of selecting, in accordance with the invention, an impulse for long-term storage. At step 300, an impulse is identified and stored in buffer storage device 46 as described in FIG. 3. Concurrently, state machine 108 determines the phase position of the impulse by reading counter 111 which free runs synchronous to the input power signal and is halted by state machine 108 when an impulse is identified. State machine 108 evaluates the duration of the impulse by reading counter 110 when the last sample of the impulse is identified at step 240 of FIG. 3.

The peak amplitude of the impulse is determined by impulse identification circuit 44 as follows. When the first sample of the impulse is identified at step 210, state machine 108 clears high magnitude sample register 116. Comparator 114 compares the magnitude of each succeeding sample of the impulse to the highest magnitude sample stored in high magnitude sample register 116. When a sample is found to have a magnitude higher than the magnitude held by high magnitude sample register 116, the contents of the register are updated. Thus, when the last sample of the impulse is identified at step 240, high magnitude sample register 116 holds the peak amplitude of the impulse for output to impulse sorting circuit 47.

At step 310, microprocessor system 52 determines on the basis of the evaluated phase position, duration, and peak amplitude whether the impulse is substantially repetitive of an impulse superimposed on an immediately preceding cycle. If the impulse is not a repeat, impulse sorter 47 directs the samples of the impulse to cache memory 48 at step 320. If the impulse is a repeat, at step 330, a memory location holding a count associated with impulses having substantially similar phase position, duration, and peak amplitude is updated and the samples of the impulse are discarded.

The low frequency sampling channel set will now be discussed. The available signals from inputs 12-30 are low-pass filtered in low-pass filter 32. Then in accordance with the invention, the signals are sampled by sampler 34 simultaneously at 7680 samples per second or 128 points per cycle of a 60 Hz power signal. Sampler 34 holds the sampled outputs for one sampling interval. Multiplexer 35 selects among the multiple outputs of sampler 34, rotating the nine outputs of sampler 34 through the two inputs of A-D converter 36 each sampling interval. The resulting sequences of analog samples are converted into sequences of digital samples by A-D converter 36. In an alternative embodiment where A-D converter 36 incorporates only one conversion circuit, multiplexer 35 rotates the nine outputs of sampler 34 through a single input of A-D converter 36. The digital sequences are converted into the frequency domain by digital signal processing circuit 38. Because sampling is accomplished simultaneously, the entire content of the input signals is captured without the introduction of error due to skewing.

The resulting frequency domain representations of the input signals are stored in cache memory unit 48. The frequency domain representations are then available for further processing by microprocessor system 52. In accordance with prior art techniques, microprocessor system 52 evaluates rms values and total harmonic distortion for the input signals.

Microprocessor system 52 identifies disturbances on the input signals and stores them on disk storage device 50. In the preferred embodiment, disturbances include the impulses selected for storage by the high frequency sampling channel and samples surrounding variations in rms values and total harmonic distortion as measured by the low frequency sampling channel. In an alternative embodiment, disturbances further include variations in rms current as measured by the low frequency sampling channel.

In accordance with the invention, power monitoring system 10 does not require advance selection of thresholds for selecting disturbances for storage. Instead, power monitoring system 10 stores all disturbances in order of increasing interest on disk storage device 50 until space is exhausted and then deletes the disturbances in order of increasing interest.

Figure 6:
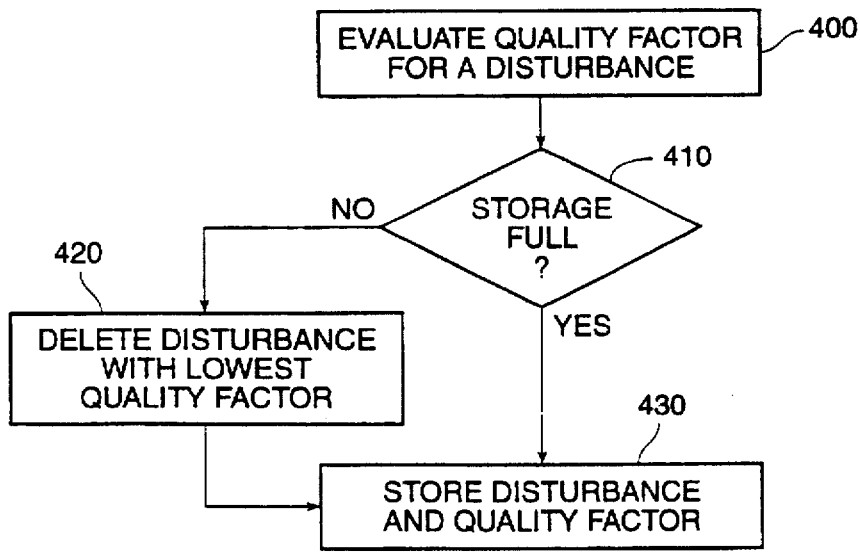
FIG. 6 is a flowchart describing the steps of conserving disturbance storage in accordance with the invention.

FIG. 6 is a flowchart describing the steps of storing a disturbance in accordance with the invention. At step 400, power monitoring system 10 evaluates a quality factor for the disturbance. If the disturbance is an impulse selected for storage by the high frequency sampling channel, the quality factor is the product of the peak amplitude and duration as evaluated by impulse identification circuit 44. If the disturbance is a fluctuation in rms voltage or total harmonic distortion, the quality factor is the product of the magnitude of the fluctuation and the duration. At step 410, microprocessor system 52 determines whether a partition of disk storage device 50 is full. If the partition is full, the disturbance within the partition with the lowest quality factor is deleted at step 420 prior to proceeding to step 430. At step 430, power monitoring system 10 stores the disturbance and associated quality factor in the partition. The quality factor may be stored either adjacent to the disturbance or in a separate index area. Alternatively, if the partition is full, microprocessor system 52 can skip the deleting step 430 and simply overwrite the lowest quality factor disturbance.

Microprocessor system 52 also retains long-term data on the rms values of the input voltage signals. In accordance with the invention, an rms voltage signal is divided into time segments. Each disturbance, whether it be an impulse, fluctuation of total harmonic distortion, or fluctuation of the rms voltage signal itself, marks the end of a first segment and the beginning of a second segment. For each segment, microprocessor system 52 stores on disk storage unit 50 the value of rms voltage during the segment, and samples surrounding both edges of the segment. By dividing the rms voltage signal into segments and only storing one rms voltage value for the duration of the segment, storage space is saved. The rms value during the segment is not stored for each sample period, instead, it is known to be the value at the beginning edge of the segment.

Figure 7:
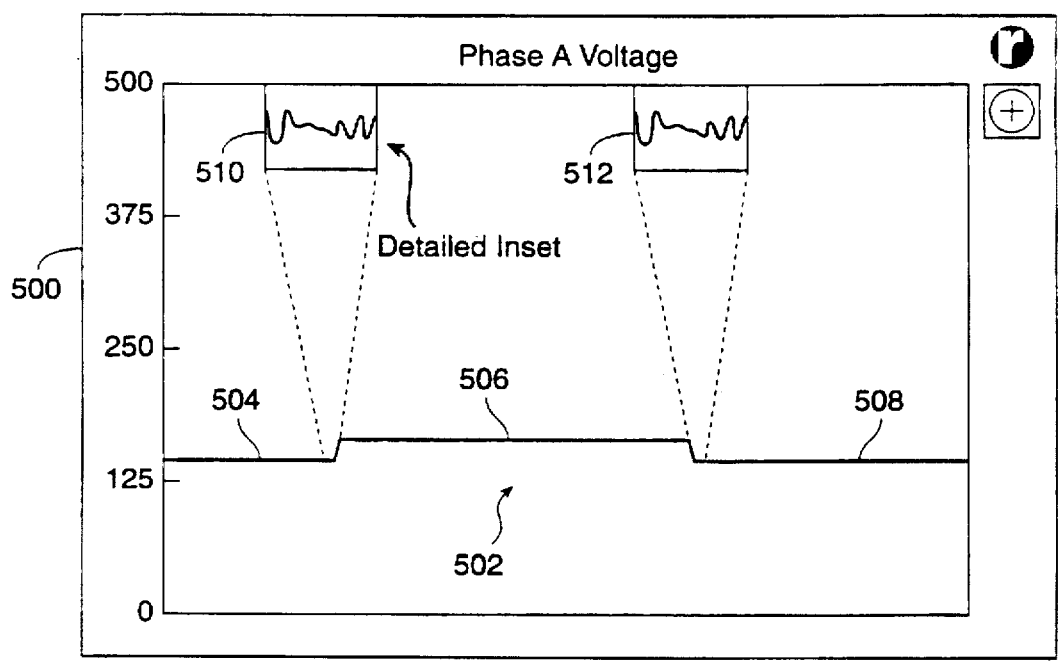
FIG. 7 illustrates a display generated in accordance with the invention, of long-term behavior of an electrical signal.

FIG. 7 illustrates a display 500 of long-term behavior of an rms voltage signal 502 generated in accordance with the invention. Display 500 can be generated by either microprocessor system 52 or computer system 54 for display by computer system 54. Rms voltage signal 502 is depicted as being divided into three segments, 504, 506, and 508. A user can select a boundary of a segment for closer inspection. Detailed insets 510 and 512 show expanded views of the samples surrounding the boundaries of segment 506.

Figure 8:
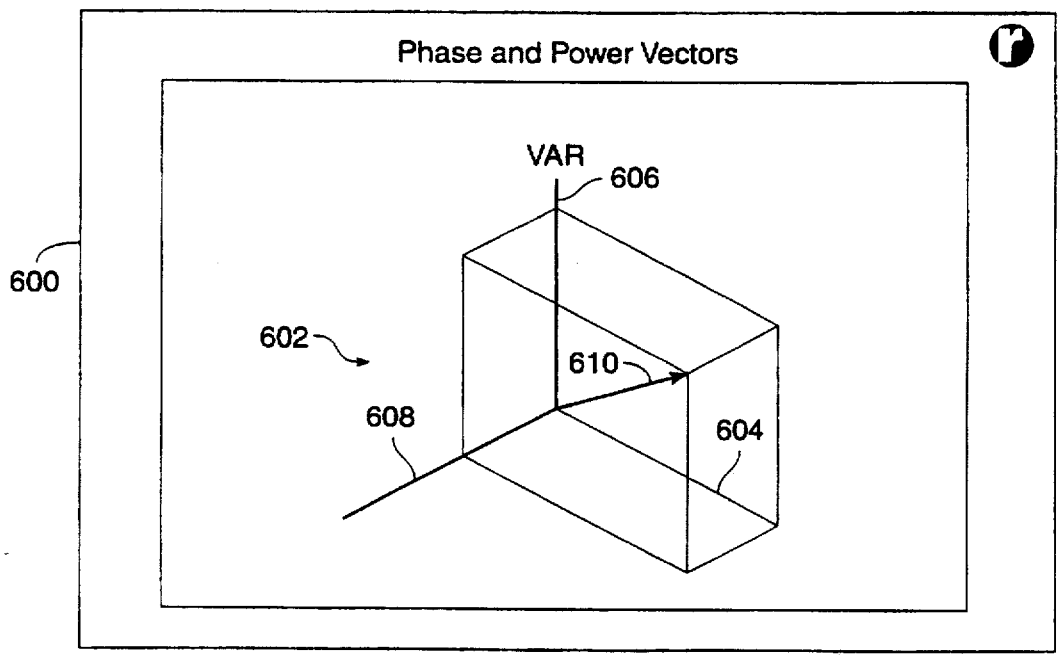
FIG. 8 illustrates a power quality information display generated in accordance with the invention wherein, power quality is summarized in a three axes graph.

FIG. 8 illustrates a power quality information display 600 generated in accordance with the invention wherein power quality is summarized in a three axes graph 602. In accordance with prior art techniques, microprocessor system 52 or computer system 54 derives power, reactive power (VAR), and total harmonic distortion from the frequency domain representations of the low frequency sampled signals. These parameters are represented by the axes, 604, 606, and 608 of graph 602. A vector 610, then points to coordinates corresponding to the parameters as measured at a selected time. For a signal with optimal power characteristics, vector 610 is coincident with axis 604 corresponding to power.

The invention has now been explained with reference to specific embodiments. Other embodiments will be apparent to those of ordinary skill in the art upon reference to the foregoing description. For example, the techniques herein described may be applied to signals other than power signals. It is therefore not intended that this invention be limited, except as indicated by the appended claims.

What is claimed is:

1. A method for recording impulses superimposed on an alternating current electrical signal, said method comprising steps of:

identifying a plurality of impulses superimposed on the alternating-current electrical signal;

evaluating for each one of said plurality of impulses, an amplitude, a duration, and a phase position, the phase position being relative to the alternating-current electrical signal; and recording, on a storage device, impulses selected from said plurality of impulses for which the amplitude, duration, and phase position are not substantially similar to the amplitude, duration, and phase position of an impulse on an immediately preceding cycle of the alternating-current electrical signal.

2. The method of claim 1 further comprising a step of:

recording, on said storage device, a count of impulses for which the amplitude, duration, and phase position are substantially similar to the amplitude, duration, and phase position of an impulse on an immediately preceding cycle of the alternating-current electrical signal.

3. The method of claim 1 further comprising steps of:

multiplying together a peak amplitude and said duration for each impulse of said plurality of impulses to obtain a quality factor;

recording the quality factors for each impulse of said plurality of impulses; and deleting impulses from said storage device in order of increasing quality factor beginning with a lowest quality factor impulse when said storage device becomes full.

4. An impulse recording instrument comprising:

an impulse identifier for identifying an impulse superimposed on a cycle of an alternating-current electrical signal;

an impulse evaluator for obtaining a duration, a peak amplitude, and a phase position, the phase position being relative to the alternating-current electrical signal, for an impulse identified by said impulse identifier;

a short-term impulse storage device coupled to said impulse evaluator for storing a plurality of impulses;

a long-term impulse storage device; and an impulse sorting circuit for selecting ones of said plurality of impulses that do not have substantially similar durations, peak amplitudes, and phase positions as impulses on immediately preceding cycles of the alternating-current electrical signal for storage in said long-term impulse storage device.

5. The impulse recording instrument of claim 4 further comprising:

a memory location holding a count of impulses for which the amplitude, duration, and phase position are substantially similar to the amplitude, duration, and phase position of an impulse on an immediately preceding cycle of the alternating-current electrical signal.

* * * * *